United States Patent
Almalki et al.

(10) Patent No.: US 9,599,694 B2
(45) Date of Patent: Mar. 21, 2017

(54) CALIBRATION OF TEMPERATURE EFFECT ON MAGNETOMETER

(71) Applicant: BlackBerry Limited, Waterloo (CA)

(72) Inventors: Nazih Almalki, Waterloo (CA); Robert George Oliver, Waterloo (CA)

(73) Assignee: BlackBerry Limited, Waterloo, Ontario (CA)

(*) Notice: Subject to any disclaimer, the term of this patent is extended or adjusted under 35 U.S.C. 154(b) by 163 days.

(21) Appl. No.: 14/703,147

(22) Filed: May 4, 2015

(65) Prior Publication Data
US 2016/0327627 A1 Nov. 10, 2016

(51) Int. Cl.
- *G01R 35/00* (2006.01)
- *G01C 19/00* (2013.01)
- *G01R 33/07* (2006.01)
- *G01C 17/38* (2006.01)

(52) U.S. Cl.
CPC ........... *G01R 35/005* (2013.01); *G01C 17/38* (2013.01); *G01C 19/00* (2013.01); *G01R 33/07* (2013.01)

(58) Field of Classification Search
USPC ............ 324/750.02, 750.03; 702/99
See application file for complete search history.

(56) References Cited

U.S. PATENT DOCUMENTS

| | | |
|---|---|---|
| 2009/0254294 A1 | 10/2009 | Dutta |
| 2011/0178707 A1 | 7/2011 | Sachs |
| 2014/0025330 A1* | 1/2014 | Bhandari ............... G01P 21/00 702/99 |
| 2015/0285835 A1* | 10/2015 | Karahan ............... G01P 21/00 73/1.38 |

OTHER PUBLICATIONS

EESR dated Sep. 9, 2016.

* cited by examiner

*Primary Examiner* — Vincent Q Nguyen
(74) *Attorney, Agent, or Firm* — Rowand LLP

(57) ABSTRACT

A method for calibrating a magnetometer following a temperature event is described. The magnetometer includes three sensors, including a Hall Effect sensor associated with a first sensing axis and a sensor of another type associated with a second sensing axis. The method includes: maintaining a cache of gyroscope data and magnetometer data representing magnetometer readings obtained from the magnetometer; detecting a temperature event; determining an expected magnetometer reading following the temperature event; comparing the expected magnetometer reading to a magnetometer reading obtained from the magnetometer after the temperature event to determine a calibration correction amount; compare a difference between the magnetometer reading obtained after the temperature event and the expected magnetometer reading for the second sensing axis to a threshold and, based on the comparison to the threshold, generating new calibration data for the magnetometer based on the calibration correction amount.

20 Claims, 3 Drawing Sheets

CALIBRATION OF TEMPERATURE EFFECT ON MAGNETOMETER

FIELD

The present disclosure relates generally to magnetometers, and more particularly, to methods and devices for determining a bias for a magnetometer following a temperature event

BACKGROUND

A magnetometer is an instrument that is used to measure the strength and/or direction of the magnetic field in the vicinity of the instrument. Electronic devices, such as smartphones, navigational devices, watches, and other electronic devices may be equipped with a magnetometer which may be used to provide a user with direction information.

Various types of magnetometers are available, and the features provided by these various types differ. For example, Hall Effect magnetometers are commonly used. These magnetometers produce a voltage that is proportional to the applied magnetic field. Hall Effect magnetometers are also able to sense polarity. Hall Effect magnetometers have become quite ubiquitous and are quite cost-effective to use. However, Hall Effect magnetometers suffer from high temperature sensitivity. That is, a bias associated with a Hall Effect magnetometer may vary greatly when a large change in temperature occurs.

Typically, devices that use Hall Effect magnetometers will lose calibration of the magnetometer following a temperature event and will require a user to take the device through a particular gesture in order to recalibrate the device.

BRIEF DESCRIPTION OF THE DRAWINGS

Reference will now be made, by way of example, to the accompanying drawings which show example embodiments of the present application, and in which.

Like reference numerals are used in the drawings to denote like elements and features.

DETAILED DESCRIPTION OF EXAMPLE EMBODIMENTS

Figure 1:
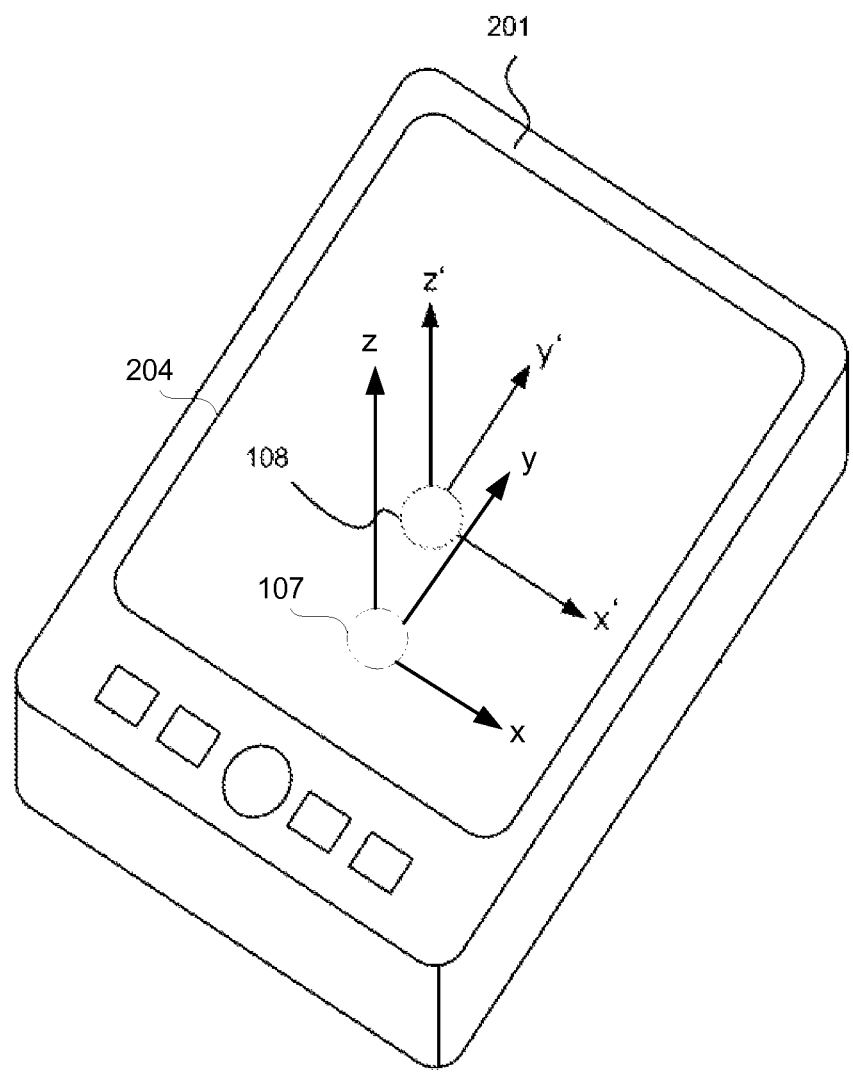
FIG. 1 is a front view of an electronic device having a magnetometer in accordance with example embodiments of the present disclosure.

In one aspect, the present disclosure provides an electronic device. The electronic device includes a magnetometer that has three sensors providing three orthogonal sensing axes. The sensors include a Hall Effect sensor associated with a first sensing axis and a sensor of another type associated with a second sensing axis. The electronic device also includes a gyroscope, a temperature sensor, a memory and a processor coupled with the magnetometer, gyroscope, temperature sensor and memory. The processor is configured to: i) maintain a cache, in the memory, of gyroscope data associated with the gyroscope and magnetometer data representing magnetometer readings obtained from the magnetometer; ii) detect a temperature event based on temperature data associated with the temperature sensor; iii) determine an expected magnetometer reading following the temperature event by determining, from the gyroscope data, an amount of rotation that occurred after a magnetometer reading obtained prior to the temperature event, and adjusting that magnetometer reading based on the amount of rotation; iv) compare the expected magnetometer reading to a magnetometer reading obtained from the magnetometer after the temperature event to determine a calibration correction amount; v) compare a difference between the magnetometer reading obtained after the temperature event and the expected magnetometer reading for the second sensing axis to a threshold and, based on the comparison to the threshold, generate new calibration data for the magnetometer based on the calibration correction amount; and vi) correct a magnetometer reading based on the new calibration data.

In another aspect, the present disclosure provides a processor-implemented method for calibrating a magnetometer on an electronic device. The magnetometer includes three sensors providing three orthogonal sensing axes. The sensors include a Hall Effect sensor associated with a first sensing axis and a sensor of another type associated with a second sensing axis. The method includes: i) maintaining a cache, in memory, of gyroscope data associated with a gyroscope on the electronic device and magnetometer data representing magnetometer readings obtained from the magnetometer; ii) detecting a temperature event based on temperature data associated with a temperature sensor on the electronic device; iii) determining an expected magnetometer reading following the temperature event by determining, from the gyroscope data, an amount of rotation that occurred after a magnetometer reading obtained prior to the temperature event, and adjusting that magnetometer reading based on the amount of rotation; iv) comparing the expected magnetometer reading to a magnetometer reading obtained from the magnetometer after the temperature event to determine a calibration correction amount; v) comparing a difference between the magnetometer reading obtained after the temperature event and the expected magnetometer reading for the second sensing axis to a threshold and, based on the comparison to the threshold, generating new calibration data for the magnetometer based on the calibration correction amount; and vi) correcting a magnetometer reading based on the new calibration data.

In yet a further aspect, the present application describes non-transitory computer-readable media storing computer-executable program instructions which, when executed, configured a processor to perform the described methods.

Other aspects and features of the present application will be understood by those of ordinary skill in the art from a review of the following description of examples in conjunction with the accompanying figures.

In the present application, the term "and/or" is intended to cover all possible combination and sub-combinations of the listed elements, including any one of the listed elements alone, any sub-combination, or all of the elements, and without necessarily excluding additional elements.

Reference is first made to FIG. 1, which illustrates an example electronic device that includes a magnetometer 107. The electronic device 201 may take many forms. By way of example, the electronic device may be a navigational system such as a global positioning system (GPS), a mobile communication device such as a mobile phone or smartphone, a tablet computer, a laptop computer, a wearable computer such as a watch, a camera, or an electronic device of another type.

In some embodiments, the electronic device 201 includes an output interface such as a display 204, and an input interface, such as a keyboard or keypad or a navigation tool such as a clickable scroll wheel (also referred to as a track wheel or thumbwheel) or trackball. The display may be a touchscreen display which acts as both an input interface, and an output interface allowing a user to provide input to the electronic device 201 by touching the display.

The magnetometer 107 is, in the example, a three-axis magnetometer which includes three orthogonal primary sensing axes denoted x, y and z. Each sensing axis is orthogonal to the other sensing axes. Each sensing axis may be associated with a separate sensor.

The magnetometer 107 is a hybrid magnetometer which includes at least two different types of sensors. At least one of the magnetometer's sensors is a Hall Effect sensor (which may also be referred to as a Hall Effect magnetometer) and at least one of the other sensors is a magnetometer of another type (i.e., is not a Hall Effect sensor). For example, in one embodiment, a Hall Effect sensor is associated with a first sensing axis, z, and non-Hall Effect sensors (which may also be referred to as non-Hall Effect magnetometers) are associated with second (x) and third sensing (y) axes. The non-Hall Effect sensors may be Anisotropic Magneto-Resistive (AMR) sensors which sense a direction of magnetization based on the AMR effect.

A Hall Effect sensor produces a voltage that is proportional to the applied magnetic field and is also able to sense polarity. While the Hall Effect sensor has a high sensitivity to temperature variations, the non-Hall Effect sensor (e.g., AMR magnetometer) used in the magnetometer 107 has a low sensitivity to temperature variations. Accordingly, when a temperature event occurs, which is characterized by a large change in temperature, the Hall Effect sensor may become improperly calibrated. The non-Hall Effect sensors, which have little sensitivity to such temperature fluctuations, tend to remain calibrated despite temperature fluctuations.

The magnetometer 107 generates a magnetometer reading, Mx, My, Mz, for each of the sensing axes x, y, z. For example, a magnetometer reading Mz may be produced by the hall effect sensor for the first sensing axis, z, and a magnetometer reading Mx may be produced by a non-Hall Effect sensor for the second sensing axis, x, and a magnetometer reading Mz may be produced by another non-Hall Effect sensor for the third sensing axis, y. These magnetometer readings Mx, My, Mz collectively form the magnetometer output. That is, the magnetometer output includes one or more electronic signals which represent the magnetometer readings Mx, My, Mz, for the sensing axes x, y, z of the magnetometer 107. The magnetometer output may, in some embodiments, be an analog output. In other embodiments, the magnetometer output may be digital. A magnetometer output captured at a point in time may be referred to as a magnetometer sample or a magnetometer reading. Such samples may be obtained, for example, at regular intervals.

The various sensors that form the magnetometer 107 may be provided in a common package, such as a common chip. This chip maintains the orthogonality of the sensing axes. This chip is fixed within the electronic device 201, so that the magnetometer readings indicate a magnetic field applied to the electronic device 201. For example, the magnetometer 107 may be a digital magnetometer provided in an integrated circuit (IC) having a memory such as Electrically Erasable Programmable Read-Only Memory (EEPROM) or flash memory, analog-to-digital (A/D) converter and a controller such as a suitably programmed microprocessor or Field Programmable Gate Array (FPGA). The IC may provide an industry standard interface such as an SPI (Serial Peripheral Interface) or I2C (Inter-Integrated Circuit) interface for connecting to a printed circuit board (PCB) of the electronic device 201.

Figure 2:
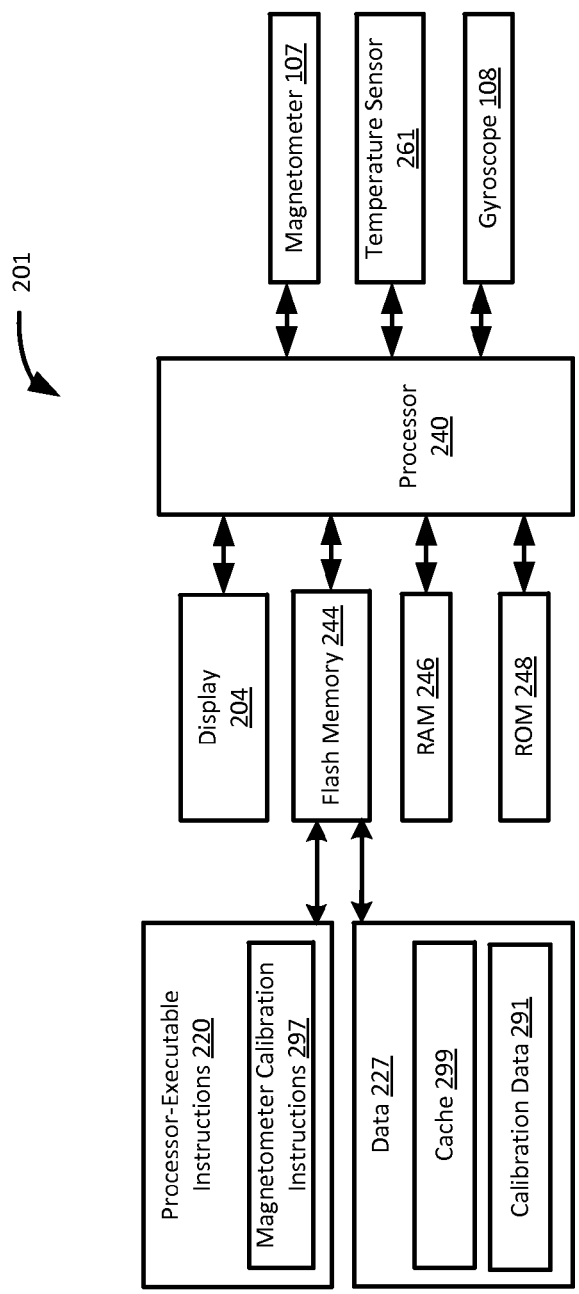
FIG. 2 is a block diagram of example components of an electronic device having a magnetometer in accordance with example embodiments of the present disclosure.

The IC may, in at least some embodiments, include a temperature sensor 261 (FIG. 2). The temperature sensor 261 may be a thermistor or a temperature sensor of another type. The temperature sensor 261 outputs an electrical signal that is dependent upon temperature. For example, a voltage associated with the electrical signal may be proportional to an ambient temperature. By providing the temperature sensor on-chip with the magnetometer 107, the electrical signal indicates the ambient temperature applied to the magnetometer 107. In this configuration, the temperature readings generated by the temperature sensor may be useful in assessing whether a temperature event has occurred that may affect the magnetometer 107. For example, the temperature readings may be useful in assessing whether a large temperature change may have affected the magnetometer's calibration.

The temperature sensor 261 (FIG. 2) may, in other embodiments, be provided external to the magnetometer 107. For example, the temperature sensor may be provided off-chip from the magnetometer 107, but in close proximity to the magnetometer 107. For example, in an embodiment, the temperature sensor 261 is located within one millimeter of a sensor on the magnetometer.

The electronic device 201 also includes an orientation sensor which may be used to determine the orientation of the electronic device 201. For example, the electronic device 201 may include a gyroscope 108 which measures rotational velocity. In the embodiment illustrated, since the gyroscope 108 is fixed within the electronic device 201, the gyroscope 108 effectively measures rotational velocity of the electronic device 201.

Like the magnetometer, the gyroscope 108 includes one or more sensing axis. In the embodiment illustrated, the gyroscope 108 includes three orthogonal primary sensing axes denoted x', y' and z'. The gyroscope 108 may produce a gyroscope reading Gx, Gy, Gz for each of the sensing axes. For example, a first gyroscope reading $G_z$ may be produced based on gyroscope readings associated with a first sensing axis, z', a second gyroscope reading $G_x$ may be produced by the gyroscope 108 based on gyroscope readings associated with a second sensing axis, x', and a third gyroscope reading $G_y$ may be produced by the gyroscope based on gyroscope readings associated with the third sensing axis, y'. The first gyroscope reading, Gz, indicates rotation about the first sensing axis (z'), the second gyroscope reading, Gx indicates rotation about the second sensing axis (x') and the third gyroscope reading, Gy, indicates rotation about the third sensing axis (y').

These gyroscope readings, Gx, Gy, Gz, collectively form the gyroscope output. That is, the gyroscope output includes one or more electronic signals which are representative of the gyroscope readings $G_x$, $G_y$, $G_z$ for the sensing axes x, y, z of the gyroscope 108. The electronic signal may, for example, provide the gyroscope readings $G_x$, $G_y$, $G_z$ for the sensing axes x', y', z' of the gyroscope 108 as measures of an amount of rotation per unit time about each sensing axis. For example, the gyroscope 108 may produce an output in terms of radians per second or degrees per second. The gyroscope output may, in some embodiments, be an analog output. In other embodiments, the gyroscope output may be digital. A gyroscope output captured at a point in time may be referred to as a gyroscope sample or a gyroscope reading. Such samples may be obtained, for example, at regular intervals.

As shown in FIG. 1, the sensing axes of the magnetometer and/or the gyroscope may be aligned with features of the form factor of the electronic device 201. In at least some embodiments, the sensing axis, z, that is associated with the Hall Effect sensor may be substantially perpendicular to a top surface of a display 204.

While the magnetometer 107 and the gyroscope 108 are illustrated as spheres in FIG. 1, this is merely for the purposes of illustration. In practice, the magnetometer 107 and the gyroscope 108 will take other forms.

Referring now to FIG. 2, a block diagram of an example electronic device 201 is illustrated. The electronic device 201 of FIG. 2 may include a housing which houses components of the electronic device 201. Internal components of the electronic device 201 may be constructed on a printed circuit board (PCB). The electronic device 201 includes a controller including at least one processor 240 (such as a microprocessor) which controls the overall operation of the electronic device 201. The processor 240 interacts with device subsystems including one or more input interfaces (such as a keyboard, one or more control buttons, one or more microphones, one or more cameras, a gyroscope 108, a temperature sensor 261, a magnetometer 107 and/or a touch-sensitive overlay associated with a touchscreen display), memory (such as flash memory 244, random access memory (RAM) 246, read only memory (ROM) 248) one or more output interfaces (such as a display 204, one or more speakers, or other output interfaces), and other device subsystems.

The electronic device 201 may store data 227 in an erasable persistent memory, which in one example embodiment is the flash memory 244. The data 227 may, in at least some embodiments, include a cache 299 of gyroscope data associated with the gyroscope 108 and magnetometer data associated with the magnetometer 107. The gyroscope data represents gyroscope readings obtained from the gyroscope and may include raw gyroscope readings generated by the gyroscope 108 or may include prepared data, such as a rotation matrix that has been prepared based on the raw gyroscope readings. Similarly, the magnetometer data represents magnetometer readings obtained from the magnetometer and may be raw magnetometer readings or may be data that is prepared from the raw magnetometer readings such as, for example, corrected magnetometer readings which have been corrected using calibration data 291 for the magnetometer.

The cache 299 maintains an association between temporally related gyroscope data and magnetometer data. That is, gyroscope data obtained from gyroscope readings taken at a particular point in time is associated, in the cache 299, with magnetometer data obtained from magnetometer readings taken at or near the same time.

The cache 299 may also include temperature data associated with the temperature sensor 261. The temperature data may include raw temperature sensor readings or may include prepared data. In either case, the temperature data represents temperature readings taken at the temperature sensor 261. The cache may maintain an association between temperature data and temporally related magnetometer data and gyroscope data. That is, temperature data obtained from temperature readings taken at a particular point in time are associated, in the cache 299 with magnetometer data and gyroscope data taken at or near the same time.

The cache may be configured to not exceed a particular size and may operate based on a first in first out (FIFO) policy in which older data is discarded to make room for newer data.

The data 227 may also include calibration data 291 for the magnetometer 107 and/or the gyroscope. The calibration data 291 includes a bias for the magnetometer. This calibration data 291 may be used, by the electronic device in order to correct raw magnetometer readings to compensate for a bias. Corrected magnetometer readings may be generated based on raw magnetometer readings and the calibration data 291.

As noted above, a Hall Effect sensor may be used to provide at least one sensing axis for the magnetometer 107. Since Hall Effect sensors have a high temperature sensitivity, magnetometers that include Hall Effect sensors may become improperly calibrated following a temperature event. A temperature event occurs when there is a relatively large change in temperature at the electronic device and, more specifically, at the magnetometer 107. A temperature event may be caused, for example, due to heating up of the electrical components in the electronic device 201 or when the ambient air temperature changes (e.g., as a user travels from indoors to outdoors or from outdoors to indoors. The electronic device 201 is configured to recalibrate the magnetometer 107 following a temperature event.

The processor 240 is associated with processor-executable instructions 220 stored in memory (such as the flash memory 244). When executed, the processor-executable instructions 220 cause the processor 240 to perform various operations, such as one or more of the methods described herein. For example, the processor executable instructions include magnetometer calibration instructions 297. These instructions configure the processor 240 to obtain calibration data 291 for the magnetometer 107. For example, these instructions may allow the electronic device to obtain new calibration data for the magnetometer following a temperature event.

In the example embodiment of FIG. 2, the magnetometer calibration instructions 297 are illustrated as being associated with a main processor 240 of the electronic device 201. However, in other embodiments, the magnetometer calibration instructions 297 could be associated with another processor, or group of processors. For example, the magnetometer 107 may include or be connected to a secondary processor. The secondary processor may provide a narrow set of functions or features and may be used to offload some processing from the main processor 240. For example, in some embodiments, the secondary processor is a magnetometer-specific processor which is coupled to the magnetometer 107 and which is configured to provide magnetometer-related functions such as calibration functions. The secondary processor may be configured to determine the bias of the magnetometer in the manner described herein and may be configured to correct for the bias. For example, the secondary processor may separate and remove the effect of the bias from magnetometer readings and may provide the resulting corrected magnetometer readings to the main processor 240 for further analysis and/or interpretation.

The secondary processor may, in at least some embodiments, be provided on an integrated circuit (IC) which also includes the magnetometer 107 and the temperature sensor 261.

The electronic device 201 will include other hardware and software apart from the components discussed above and illustrated in FIG. 2. For example, while not illustrated in FIG. 2, the electronic device 201 also includes or is connectable to a power source, such as a battery.

Figure 3:
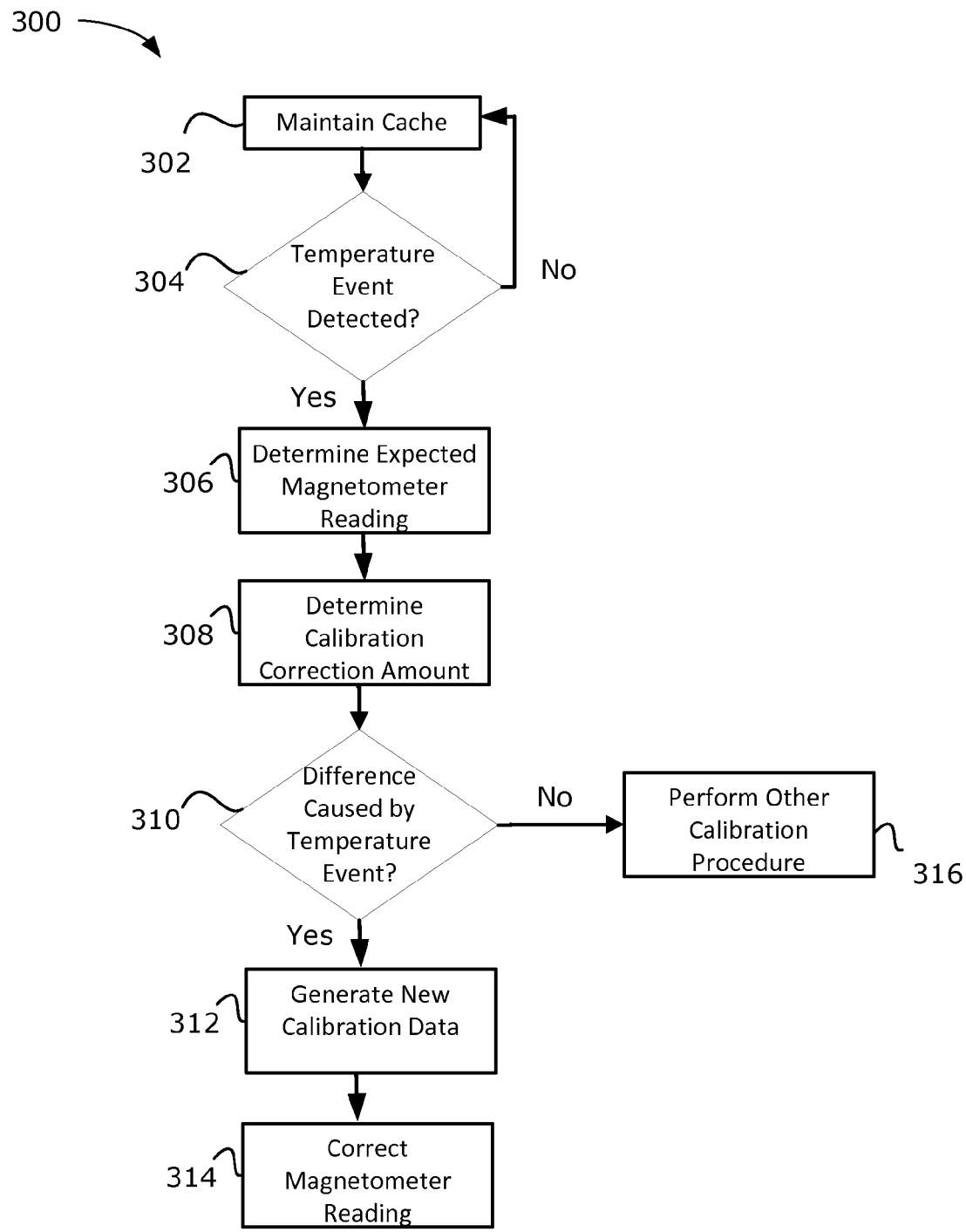
FIG. 3 is a flowchart of an example method for calibrating a magnetometer in accordance with example embodiments of the present disclosure.

As noted previously, a magnetometer that has high temperature sensitivity may become improperly calibrated following a temperature event. Referring now to FIG. 3, an example of a method 300 for calibrating a magnetometer following a temperature event is illustrated. A non-transitory computer readable storage medium associated with the electronic device 201 (FIG. 2) may include processor-executable instructions 220 (e.g., magnetometer calibration instructions 297 (FIG. 2)) which, when executed by a processor 240 (FIG. 2), configure the processor to perform the method 300 of FIG. 3. The processor 240 configured to perform the method 300 may be the main processor or a secondary processor.

In other embodiments, one or more of the functions or features of the method 300 may be performed, in whole or in part, by another system, software application, module, component, processor or device apart from those specifically listed above.

At operation 302, the processor maintains a cache, in memory (such as the flash memory). The cache includes gyroscope data associated with the gyroscope 108 and magnetometer data associated with the magnetometer 107. The gyroscope data may be raw data generated by the gyroscope 108 or may be prepared data that has been generated based on the raw data generated by the gyroscope 108. For example, in some embodiments, the gyroscope data may be a rotation matrix which indicates the amount of rotation of the electronic device 201. That is, the rotation matrix may indicate the current orientation of the electronic device 201. Like the gyroscope data, the magnetometer data may be raw data generated by the magnetometer 107 or it may be prepared data generated based on such raw data.

The cache may also store temperate data associated with the temperature sensor 261. For example, raw or prepared temperature readings generated by the temperature sensor may be stored as temperature data. The temperature data indicates a temperature observed at the temperature sensor.

Data stored in the cache 299 may be temporally related with other data stored in the cache 299 and the cache maintains temporal relationships between various data. For example, gyroscope data may be associated, in the cache, with magnetometer data representing magnetometer reading taken at or near the same time. Similarly, temperature data may be associated with gyroscope data and/or magnetometer data taken at or near the same time.

The cache is periodically updated as new readings are generated by the magnetometer, gyroscope, and/or temperature sensor. The cache may be of a particular size and older data may be removed from the cache when additional space is needed to store new data.

At operation 304, the processor determines whether a temperature event has occurred. A temperature event occurs when the temperature changes by a large amount. The detection of a temperature event may be performed based on one or more thresholds. For example, when a temperature change exceeds the threshold, then the temperature event may be determined to have occurred. The threshold may, in at least some embodiments, be stored in memory.

In performing operation 304, the processor may retrieve cached temperature data from memory and may determine a temperature change based on the cached temperature data. For example, the processor may determine a temperature change based on temperature data representing a temperature observed at the temperature sensor at two different points in time. This temperature change may be compared with the threshold and, if the temperature change exceeds the threshold, then a temperature event is detected.

If a temperature event has not occurred, the processor may continue with the caching operation 302.

If a temperature event is detected, then at operation 306, the processor determines an expected magnetometer reading. The expected magnetometer reading may be determined by taking a magnetometer reading obtained at a pre-temperature event time (i.e., prior to the temperature event) as a starting point and adjusting that magnetometer reading to account for the amount of rotation of the electronic device that occurred following the temperature event. More specifically, an amount of rotation that occurred following the pre-temperature event time when the magnetometer reading that is to be adjusted was obtained may be determined and that magnetometer reading may be adjusted based on the amount of rotation occurring since the pre-temperature event time. The magnetometer reading that is adjusted may be retrieved from the cache and the magnetometer reading that is adjusted is a magnetometer reading which has been adjusted based on prior calibration data.

To make the adjustment to the magnetometer reading represented by the magnetometer data, a rotation matrix may be obtained from gyroscope data. The rotation matrix represents the amount of rotation of the electronic device between a post-temperature event time (i.e., a time following the temperature event) and the pre-temperature event time (i.e., the time when the magnetometer reading that is to be adjusted was obtained). The rotation matrix indicating the amount of rotation of the electronic device 201 between these two times may be determined from a first rotation matrix and a second rotation matrix. The first rotation matrix represents the angular rotation of the electronic device at the pre-temperature event time and the second rotation matrix represents the angular rotation of the electronic device at the post-temperature event time. More particularly, the first rotation matrix is determined from gyroscope data obtained at or near the time when the magnetometer reading that is to be adjusted was obtained. The second rotation matrix is determined from gyroscope data obtained following the temperature event.

After the expected magnetometer reading is determined by adjusting the magnetometer reading obtained prior to the temperature event to account for the amount of rotation represented by the rotation matrix, at operation 308 the processor compares the expected magnetometer reading to a magnetometer reading obtained from the magnetometer after the temperature event to determine a calibration correction amount. That is, the expected magnetometer reading that has been adjusted to account for the amount of rotation occurring between the pre-temperature event time and the post-temperature event time is compared with an actual magnetometer reading obtained at or near the post-temperature event time. The difference between the expected magnetometer reading and the actual magnetometer reading (which may be a reading which was corrected based on the currently stored calibration data for the magnetometer) yields a calibration correction amount.

If the temperature event was the sole cause for the magnetometer to lose its calibration, then the calibration correction amount may be used to re-calibrate the magnetometer without having to prompt a user to perform a recalibration routine. However, if the temperature event was not the sole factor which caused the magnetometer to become uncalibrated, then a different calibration technique may be performed. For example, the magnetometer may also have been exposed to an external magnetic field when the temperature event occurred and at least part of the loss of calibration may be due to the effect of this magnetic field.

Thus, at operation 310, the processor may determine whether the temperature event was the cause of the de-calibration of the magnetometer. Since the magnetometer includes a sensor associated with a sensing axis (i.e., the second sensing axis) that is not a Hall Effect sensor, the temperature event will have little effect on this sensing axis. A difference between the actual magnetometer reading (i.e., the magnetometer reading obtained from the magnetometer after the temperature event) and the expected magnetometer reading is determined for the second sensing axis. If the temperature event was the primary cause of the de-calibration of the magnetometer, this difference should be close to zero. Thus, the processor may compare the difference to a threshold, which may be a threshold that is near zero, and if the difference is less than the threshold, the processor may determine that the de-calibration was caused by the temperature event and proceed to operation 312.

At operation 312, the processor generates new calibration data. The new calibration data may be generated based on the calibration correction amount. For example, old calibration data may be adjusted based on the calibration correction amount obtained at operation 308 to yield the new calibration data. The new calibration data may be stored in memory and may be used to correct a magnetometer reading at operation 314.

If, at operation 310, the processor determines that the temperature event was not the sole cause of the de-calibration, then at operation 316, a further calibration technique may be performed in order to generate new calibration data. For example, in one embodiment, the electronic device may prompt a user to perform a series of actions with the electronic device. The device may ask the user to move the electronic device in a series of known orientations.

In some embodiments, at operation 310 additional analyses may be performed in order to determine whether the temperature event was the sole cause of the de-calibration. For example, in an embodiment the magnetometer may include another non-Hall Effect sensor. This other sensor may be associated with a third sensing axis. A similar analysis to that performed on the second sensing axis may be performed on this third sensing axis. A difference between the actual magnetometer reading (i.e., the magnetometer reading obtained from the magnetometer after the temperature event) and the expected magnetometer reading is determined for the third sensing axis. The processor may compare the difference to a threshold, which may be a threshold that is near zero, and if the difference is less than the threshold, the processor may determine that the de-calibration was caused by the temperature event and proceed to operation 312.

In another embodiment, at operation 310 the magnetometer readings for the Hall

Effect sensor may be evaluated to confirm that there is a sufficient degree of change in the readings at that sensor following the temperature event. For example, a difference between the actual magnetometer reading and the expected magnetometer reading for the first axis (i.e., the axis associated with the Hall Effect sensor) may be compared with a threshold. If the difference is less than the threshold, then the processor may determine that the temperature event was not the sole cause of the de-calibration and may perform another calibration technique at operation 316.

Similarly, in at least some embodiments, the calibration correction amount may be evaluated at operation 310 to determine whether the temperature event was the sole cause of the de-calibration. For example, memory associated with the electronic device may store data indicating an expected range of change in calibration data for various temperature changes. For example a range of acceptable calibration correction amounts for a given temperature change may be stored in memory and this data may be evaluated to determine whether the temperature event was the sole cause of the de-calibration. If the calibration correction amount determined at operation 308 is within an expected amount for the temperature change associated with the temperature event, then the temperature event alone may have caused the de-calibration. However, if the calibration correction amount is not within the expected range, then the temperature event may not be the sole cause and another calibration technique may be performed at operation 316.

In at least some embodiments, if any one of the techniques for determining whether a temperature event was the sole cause for the de-calibration suggests that another factor may have caused the de-calibration, then the other calibration technique may be performed at operation 316 and operation 312 may not be performed. For example, if the difference between the actual magnetometer reading and the expected magnetometer reading at either one of the second or third axis is less than the threshold, then the other calibration technique is performed.

In some embodiments, prior to generating the new calibration data at operation 312, the processor also tests the integrity of the gyroscope data. For example, in some embodiments (not shown) prior to operation 312, the processor considers whether the gyroscope was saturated between the pre-temperature event time and the post-temperature event time. Gyroscope saturation occurs when a gyroscope is rotated at a speed which is beyond the gyroscope's measurement capabilities. When saturation occurs, the gyroscope may produce an output (referred to as a "saturated output") that is the same regardless of the degree to which the gyroscope is saturated. That is, whenever the gyroscope 108 is saturated, it may produce the same output. If the gyroscope 108 is rotating at a rate which is slightly above its operating range, it will produce the same saturated output which is produced when the gyroscope 108 is rotating at a rate which is well above its operating range. In some embodiments, the saturated output may be the highest output that the gyroscope 108 generates. That is, the saturated output may be the highest gyroscope reading generated by the gyroscope 108. In such embodiments, the electronic device 201 may determine whether the gyroscope 108 is saturated by monitoring gyroscope readings and by determining whether a current reading reflects the highest gyroscope reading for the gyroscope 108. That is, if the electronic device 201 determines that the gyroscope reading is the highest reading observed for the gyroscope 108, then the electronic device 201 may determine that the gyroscope 108 is saturated. The evaluation as to whether the gyroscope reading represents the highest reading observed may, in at least some embodiments, be performed on a per-axis basis. That is, the electronic device 201 may store the highest reading observed for each axis and may determine whether the gyroscope 108 is saturated by comparing the current gyroscope reading for each axis to the highest reading observed for that axis.

If the gyroscope was saturated, then the orientation of the electronic device may not be represented by the gyroscope data. Thus, if saturation has occurred, the processor may proceed to perform another calibration technique at operation 316. However, if the processor determines that the gyroscope was not saturated between the pre-temperature event time and the post-temperature event time, then the calibration technique of operation 312 may be performed.

Some gyroscopes are equipped with an output which will be referred to as a "gyroscope calibrated output" which indicates whether the gyroscope has confidence that its own output is reliable. That is, the gyroscope calibrated output indicates whether the gyroscope is reliably calibrated. In some such embodiments, prior to generating the new calibration data at operation 312, the processor evaluates the gyroscope calibrated output. If the processor determines that the gyroscope was reliably calibrated at the post-temperature event time and the pre-temperature event time then the processor may perform the calibration technique of operation 312. However, if the gyroscope was not reliably calibrated, then the other calibration technique may be performed at operation 316.

While the present disclosure is primarily described in terms of methods, a person of ordinary skill in the art will understand that the present disclosure is also directed to various apparatus such as a handheld electronic device including components for performing at least some of the aspects and features of the described methods, be it by way of hardware components, software or any combination of the two, or in any other manner. Moreover, an article of manufacture for use with the apparatus, such as a pre-recorded storage device or other similar computer readable storage medium including program instructions recorded thereon (which may, for example, cause a processor to perform one or more of the methods described herein), or a computer data signal carrying computer readable program instructions may direct an apparatus to facilitate the practice of the described methods. It is understood that such apparatus, articles of manufacture, and computer data signals also come within the scope of the present disclosure.

The term "computer readable storage medium" as used herein means any medium which can store instructions for use by or execution by a computer or other computing device including, but not limited to, a portable computer diskette, a hard disk drive (HDD), a random access memory (RAM), a read-only memory (ROM), an erasable programmable-read-only memory (EPROM) or flash memory, an optical disc such as a Compact Disc (CD), Digital Versatile/Video Disc (DVD) or Blu-ray™ Disc, and a solid state storage device (e.g., NAND flash or synchronous dynamic RAM (SDRAM)).

The embodiments of the present disclosure described above are intended to be examples only. Those of skill in the art may effect alterations, modifications and variations to the particular embodiments without departing from the intended scope of the present disclosure. In particular, features from one or more of the above-described embodiments may be selected to create alternate embodiments comprised of a sub-combination of features which may not be explicitly described above. In addition, features from one or more of the above-described embodiments may be selected and combined to create alternate embodiments comprised of a combination of features which may not be explicitly described above. Features suitable for such combinations and sub-combinations would be readily apparent to persons skilled in the art upon review of the present disclosure as a whole. The subject matter described herein and in the recited claims intends to cover and embrace all suitable changes in technology.

The invention claimed is:

1. An electronic device comprising:
   a magnetometer comprising three sensors providing three orthogonal sensing axes, the sensors including a Hall Effect sensor associated with a first sensing axis and a sensor of another type associated with a second sensing axis;
   a gyroscope;
   a temperature sensor;
   a memory; and
   a processor coupled with the magnetometer, gyroscope, temperature sensor and memory, the processor configured to:
   maintain a cache, in the memory, of gyroscope data associated with the gyroscope and magnetometer data representing magnetometer readings obtained from the magnetometer;
   detect a temperature event based on temperature data associated with the temperature sensor;
   determine an expected magnetometer reading following the temperature event by determining, from the gyroscope data, an amount of rotation that occurred after a magnetometer reading obtained prior to the temperature event, and adjusting that magnetometer reading based on the amount of rotation;
   compare the expected magnetometer reading to a magnetometer reading obtained from the magnetometer after the temperature event to determine a calibration correction amount;
   compare a difference between the magnetometer reading obtained after the temperature event and the expected magnetometer reading for the second sensing axis to a threshold and, based on the comparison to the threshold, generate new calibration data for the magnetometer based on the calibration correction amount; and
   correct a magnetometer reading based on the new calibration data.

2. The electronic device of claim 1, wherein the sensors include a second sensor of the other type associated with a third sensing axis and wherein the processor is further configured to, prior to generating the new calibration data:
   determine that a difference between the actual magnetometer reading and the expected magnetometer reading for the third sensing axis is less than a threshold.

3. The electronic device of claim 1, wherein the processor is further configured to, prior to generating the new calibration data:
   determine that a difference between the actual magnetometer reading and the expected magnetometer reading for the first sensing axis is greater than a threshold.

4. The electronic device of claim 1, wherein the expected magnetometer reading is determined based on magnetometer data obtained at a pre-temperature event time and based on a rotation matrix obtained from the gyroscope data, the rotation matrix representing the amount of rotation of the electronic device between a post-temperature event time and the pre-temperature event time.

5. The electronic device of claim 4, wherein the processor is further configured to:
   determine the rotation matrix from a first rotation matrix representing the angular rotation of the electronic device at the pre-temperature event time and a second rotation matrix representing the angular rotation of the electronic device at the post-temperature event time.

6. The electronic device of claim 4, wherein the processor is further configured to, prior to correcting the magnetometer reading:
   determine that the gyroscope was not saturated between the pre-temperature event time and the post-temperature event time.

7. The electronic device of claim 4, wherein the gyroscope is configured to provide a gyroscope calibrated output, the gyroscope calibrated output indicating whether the gyroscope is reliably calibrated, and wherein the processor is further configured to, prior to generating the new calibration data, determine that the gyroscope was reliably calibrated at the post-temperature event time and the pre-temperature event time based on the gyroscope calibrated output.

8. The electronic device of claim 1, wherein the cache includes temperature data associated with the temperature sensor.

9. The electronic device of claim 1, wherein detecting a temperature event comprises determining that a temperature change exceeds a threshold.

10. The electronic device of claim 1, wherein the temperature sensor and the magnetometer are provided in a common package.

11. The electronic device of claim 1, wherein the sensor of another type is an anistropic magnetoresistance sensor.

12. The electronic device of claim 1, wherein the processor is further configured to:
determine that the calibration correction amount was within an expected amount for a temperature change associated with the temperature event.

13. A processor-implemented method for calibrating a magnetometer on an electronic device, the magnetometer comprising three sensors providing three orthogonal sensing axes, the sensors including a Hall Effect sensor associated with a first sensing axis and a sensor of another type associated with a second sensing axis, the method comprising:
maintaining a cache, in memory, of gyroscope data associated with a gyroscope on the electronic device and magnetometer data representing magnetometer readings obtained from the magnetometer;
detecting a temperature event based on temperature data associated with a temperature sensor on the electronic device;
determining an expected magnetometer reading following the temperature event by determining, from the gyroscope data, an amount of rotation that occurred after a magnetometer reading obtained prior to the temperature event, and adjusting that magnetometer reading based on the amount of rotation;
comparing the expected magnetometer reading to a magnetometer reading obtained from the magnetometer after the temperature event to determine a calibration correction amount;
comparing a difference between the magnetometer reading obtained after the temperature event and the expected magnetometer reading for the second sensing axis to a threshold and, based on the comparison to the threshold, generating new calibration data for the magnetometer based on the calibration correction amount; and
correcting a magnetometer reading based on the new calibration data.

14. The method of claim 13, wherein the sensors include a second sensor of the other type associated with a third sensing axis, the method further comprising, prior to generating the new calibration data:
determining that a difference between the actual magnetometer reading and the expected magnetometer reading for the third sensing axis is less than a threshold.

15. The method of claim 13, further comprising, prior to generating the new calibration data:
determining that a difference between the actual magnetometer reading and the expected magnetometer reading for the first sensing axis is greater than a threshold.

16. The method of claim 14, wherein the expected magnetometer reading is determined based on magnetometer data obtained at a pre-temperature event time and based on a rotation matrix obtained from the gyroscope data, the rotation matrix representing the amount of rotation of the electronic device between a post-temperature event time and the pre-temperature event time.

17. The method of claim 16, further comprising:
determining the rotation matrix from a first rotation matrix representing the angular rotation of the electronic device at the pre-temperature event time and a second rotation matrix representing the angular rotation of the electronic device at the post-temperature event time.

18. A non-transitory computer readable medium comprising computer executable instructions for calibrating a magnetometer on an electronic device, the magnetometer comprising three sensors providing three orthogonal sensing axes, the sensors including a hall effect sensor associated with a first sensing axis and a sensor of another type associated with a second sensing axis, the instructions comprising:
instructions for maintaining a cache, in memory, of gyroscope data associated with a gyroscope on the electronic device and magnetometer data representing magnetometer readings obtained from the magnetometer;
instructions for detecting a temperature event based on temperature data associated with a temperature sensor on the electronic device;
instructions for determining an expected magnetometer reading following the temperature event by determining, from the gyroscope data, an amount of rotation that occurred after a magnetometer reading obtained prior to the temperature event, and adjusting that magnetometer reading based on the amount of rotation;
instructions for comparing the expected magnetometer reading to a magnetometer reading obtained from the magnetometer after the temperature event to determine a calibration correction amount;
instructions for comparing a difference between the magnetometer reading obtained after the temperature event and the expected magnetometer reading for the second sensing axis to a threshold and, based on the comparison to the threshold, generating new calibration data for the magnetometer based on the calibration correction amount; and
instructions for correcting a magnetometer reading based on the new calibration data.

19. The non-transitory computer readable medium of claim 18, wherein the sensors include a second sensor of the other type associated with a third sensing axis, the instructions comprising instructions for, prior to generating the new calibration data:
determining that a difference between the actual magnetometer reading and the expected magnetometer reading for the third sensing axis is less than a threshold.

20. The non-transitory computer readable medium of claim 18, wherein the sensors include a second sensor of the other type associated with a third sensing axis, the instructions comprising instructions for, prior to generating the new calibration data:

determining that a difference between the actual magnetometer reading and the expected magnetometer reading for the first sensing axis is greater than a threshold.

* * * * *